(12) United States Patent
Groothuis et al.

(10) Patent No.: US 10,215,500 B2
(45) Date of Patent: Feb. 26, 2019

(54) SEMICONDUCTOR DEVICE ASSEMBLY WITH VAPOR CHAMBER

(71) Applicant: Micron Technology, Inc., Boise, ID (US)

(72) Inventors: Steven K. Groothuis, Boise, ID (US); Jian Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 191 days.

(21) Appl. No.: 14/720,015

(22) Filed: May 22, 2015

(65) Prior Publication Data

US 2016/0343639 A1 Nov. 24, 2016

(51) Int. Cl.
*H01L 23/467* (2006.01)
*H01L 25/00* (2006.01)
(Continued)

(52) U.S. Cl.
CPC ....... *F28D 15/043* (2013.01); *F28D 15/0233* (2013.01); *F28D 15/0266* (2013.01); *F28D 15/046* (2013.01); *H01L 23/3675* (2013.01); *H01L 23/427* (2013.01); *H01L 24/13* (2013.01); *H01L 24/16* (2013.01); *H01L 24/17* (2013.01); *H01L 24/32* (2013.01); *H01L 24/73* (2013.01); *H01L 25/0657* (2013.01); *H01L 25/18* (2013.01); *H01L 25/50* (2013.01); *H01L 2224/131* (2013.01); *H01L 2224/13025* (2013.01); *H01L 2224/13147* (2013.01); *H01L 2224/16146* (2013.01); *H01L 2224/16227* (2013.01); *H01L 2224/17181* (2013.01); *H01L 2224/32145* (2013.01); *H01L 2224/32245* (2013.01); *H01L 2224/73203* (2013.01); *H01L 2224/73204* (2013.01); *H01L 2224/73253* (2013.01); *H01L 2225/06513* (2013.01);
(Continued)

(58) Field of Classification Search
None
See application file for complete search history.

(56) References Cited

U.S. PATENT DOCUMENTS 6,082,443 A * 7/2000 Yamamoto .......... F28D 15/0233
165/104.21
2004/0211549 A1 * 10/2004 Garner ................ F28D 15/0233
165/104.26

(Continued)

*Primary Examiner* — Robert K Carpenter
(74) *Attorney, Agent, or Firm* — Perkins Coie LLP

(57) ABSTRACT

Semiconductor device assemblies having stacked semiconductor dies and thermal transfer devices that include vapor chambers are disclosed herein. In one embodiment, a semiconductor device assembly includes a first semiconductor die, a second semiconductor die at a base region of the first die, and a thermal transfer device attached to a peripheral region of the first die and extending over the second die. The thermal transfer device includes a conductive structure having an internal cavity and a working fluid at least partially filling the cavity. The conductive structure further includes first and second fluid conversion regions adjacent the cavity. The first fluid conversion region transfers heat from at least the peripheral region of the first die to a volume of the working fluid to vaporize the volume in the cavity, and the second fluid conversion region condenses the volume of the working fluid in the cavity after it has been vaporized.

31 Claims, 6 Drawing Sheets

(51) Int. Cl.
    *H01L 23/373*     (2006.01)
    *H01L 25/18*     (2006.01)
    *H01L 21/48*     (2006.01)
    *F28D 15/04*     (2006.01)
    *H01L 23/367*     (2006.01)
    *H01L 23/427*     (2006.01)
    *F28D 15/02*     (2006.01)
    *H01L 23/00*     (2006.01)
    *H01L 25/065*     (2006.01)

(52) U.S. Cl.
CPC ............... *H01L 2225/06517* (2013.01); *H01L 2225/06541* (2013.01); *H01L 2225/06589* (2013.01); *H01L 2924/1431* (2013.01); *H01L 2924/1434* (2013.01); *H01L 2924/1436* (2013.01); *H01L 2924/1437* (2013.01); *H01L 2924/1438* (2013.01); *H01L 2924/1632* (2013.01); *H01L 2924/16235* (2013.01); *H01L 2924/16251* (2013.01)

(56) References Cited

U.S. PATENT DOCUMENTS

2010/0117209 A1\*   5/2010   Bezama ................ H01L 23/427
                                                                                          257/686
2010/0148356 A1\*   6/2010   Tamaki ................ H01L 23/427
                                                                                          257/712

\* cited by examiner

SEMICONDUCTOR DEVICE ASSEMBLY WITH VAPOR CHAMBER

TECHNICAL FIELD

The disclosed embodiments relate to semiconductor device assemblies, and in particular to semiconductor device assemblies having thermal transfer devices that include vapor chambers.

BACKGROUND

Packaged semiconductor dies, including memory chips, microprocessor chips, and imager chips, typically include a semiconductor die mounted on a substrate and encased in a plastic protective covering. The die includes functional features, such as memory cells, processor circuits, and imager devices, as well as bond pads electrically connected to the functional features. The bond pads can be electrically connected to terminals outside the protective covering to allow the die to be connected to higher level circuitry.

Semiconductor manufacturers continually reduce the size of die packages to fit within the space constraints of electronic devices, while also increasing the functional capacity of each package to meet operating parameters. One approach for increasing the processing power of a semiconductor package without substantially increasing the surface area covered by the package (i.e., the package's "footprint") is to vertically stack multiple semiconductor dies on top of one another in a single package. The dies in such vertically-stacked packages can be interconnected by electrically coupling the bond pads of the individual dies with the bond pads of adjacent dies using through-silicon vias (TSVs). In vertically stacked packages, the heat generated is difficult to dissipate, which increases the operating temperatures of the individual dies, the junctions therebetween, and the package as a whole. This can cause the stacked dies to reach temperatures above their maximum operating temperatures ($T_{max}$) in many types of devices.

DETAILED DESCRIPTION

Specific details of several embodiments of semiconductor device assemblies having thermal transfer devices that include vapor chambers are described below. The term "semiconductor device" generally refers to a solid-state device that includes semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates). As used herein, the terms "vertical," "lateral," "upper," and "lower" can refer to relative directions or positions of features in the semiconductor device in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1:
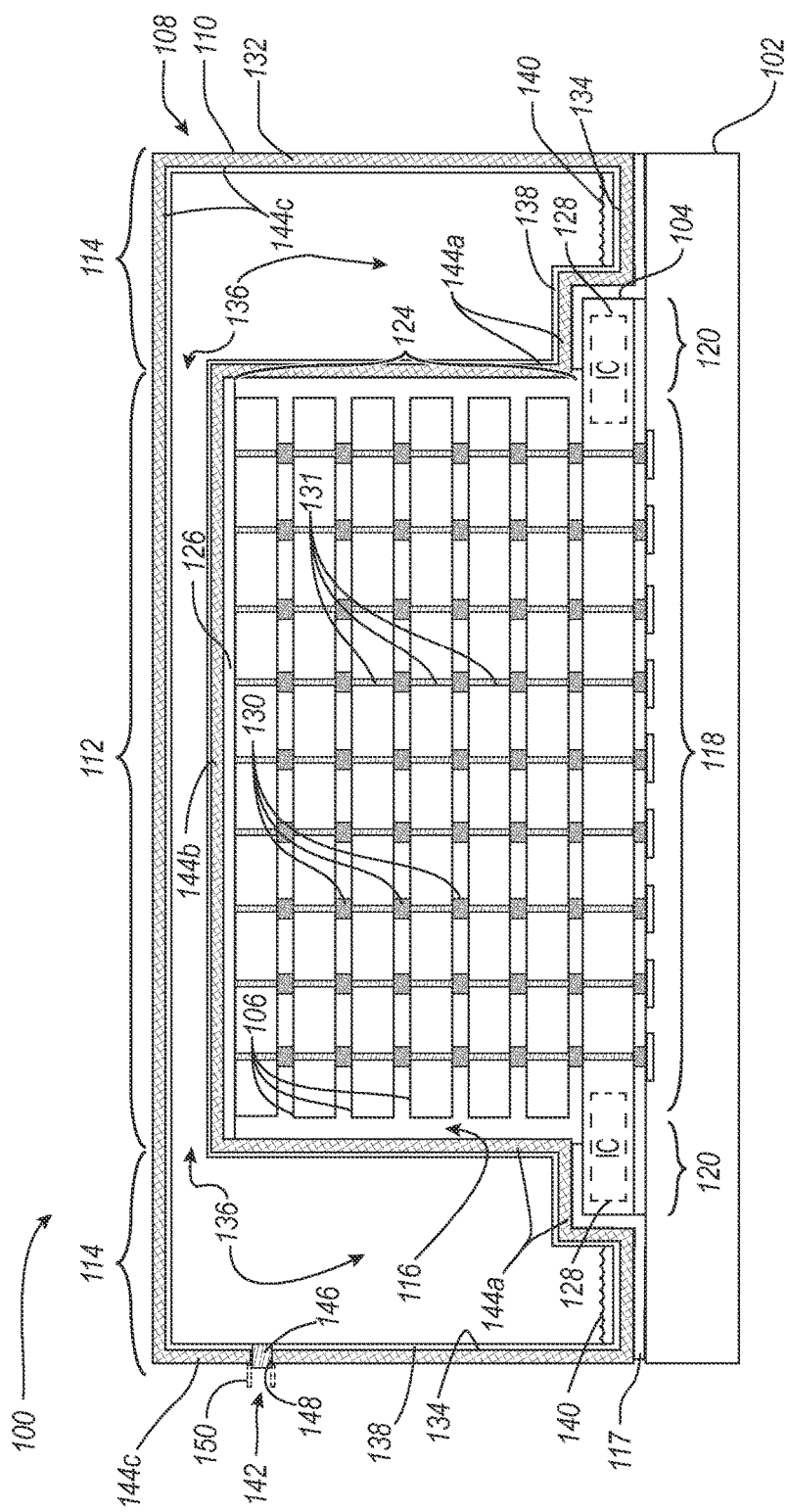
FIG. 1 is a cross-sectional view of a semiconductor device assembly configured in accordance with an embodiment of the present technology.

FIG. 1 is a cross-sectional view of a semiconductor device assembly 100 ("assembly 100") configured in accordance with an embodiment of the present technology. As shown, the assembly 100 includes a package support substrate 102 (e.g., an interposer), a first semiconductor die 104 on the substrate 102, a plurality of second semiconductor dies 106 mounted to the first die 104, and a thermal transfer device (TTD) 108 over the first and second dies 104 and 106. The TTD 108 includes a conductive structure, or envelope 110, having an upper region 112 extending over the second dies 106, and an outer region 114 attached to the package support substrate 102 with a first adhesive 117. The TTD 108 and the first die 104 form an enclosure 116 that contains the plurality of second dies 106.

The first die 104 includes a base region 118 and a peripheral region 120 (known to those skilled in the art as a "porch" or "shelf") adjacent the base region 118. The second dies 106 are arranged in a stack 124 ("die stack 124") on the base region 118 and attached to the upper region 112 of the TTD 108 with a second adhesive 126, which can be the same adhesive as the first adhesive 117 or a different adhesive. Suitable adhesives can include, for example, a thermal interface material ("TIM") or other adhesive containing, e.g., silicone-based greases, gels, or adhesives that are doped with conductive materials (e.g., carbon nano-tubes, solder materials, diamond-like carbon (DLC), etc.), as well as phase-change materials.

The first and second dies 104 and 106 can include various types of semiconductor components and functional features, such as dynamic random-access memory (DRAM), static random-access memory (SRAM), flash memory, other forms of integrated circuit memory, processing circuits, imaging components, and/or other semiconductor features. In various embodiments, for example, the assembly 100 can be configured as a hybrid memory cube (HMC) in which the stacked second dies 106 are DRAM dies or other memory dies that provide data storage and the first die 104 is a high-speed logic die that provides memory control (e.g., DRAM control) within the HMC. In other embodiments, the first and second dies 104 and 106 may include other semiconductor components and/or the semiconductor components of the individual second dies 106 in the die stack 124 may differ. In the embodiment illustrated in FIG. 1, the first die 104 includes an integrated circuit 128 that extends at least partially into the peripheral region 120. In one embodiment, the portion of the integrated circuit 128 that extends into the peripheral region 120 can include one or more circuit components that produce relatively large amounts of heat during operation, such as serial/deserializer (SERDES) circuits. In a related embodiment, circuit components that produce relatively smaller amounts of heat during operation can be located away from the peripheral region and/or directly beneath the die stack.

The die stack 124 can be electrically coupled to the package support substrate 102 and to one another by a plurality of electrically conductive elements 130 (e.g., copper pillars, solder bumps, and/or other conductive features). Each of the first and second dies 104 and 106 can include a plurality of through-silicon vias (TSVs) 131 that are coupled on opposite sides to the conductive elements 130. In addition to electrical communication, the conductive elements 130 and the TSVs 131 transfer heat away from the die stack 124 and toward the TTD 108. In some embodiments, the assembly 100 can also include a plurality of thermally conductive elements or "dummy elements" (not shown) positioned interstitially between the first and second dies 104 and 106 to further facilitate heat transfer through the die stack 124. Such dummy elements can be at least generally similar in structure and composition to the conductive elements 130 and/or the TSVs 131 except that they are not electrically coupled to the functional circuitry of the first and second dies 104 and 106. In some embodiments, the assembly 100 can further include an underfill material (not shown) between each of the second dies 106 and between the first die 104 and the bottom second die 106 to provide mechanical support and electrical isolation between the conductive elements 130.

In the embodiment illustrated in FIG. 1, the envelope 110 of the TTD 108 includes a continuous conductive wall 132 having an interior surface 134 that defines an internal cavity 136 (e.g., a vapor chamber), a wicking feature 138 covering at least a portion of the interior surface 134, and a working fluid 140 (e.g., a heat transfer fluid) partially filling the cavity 136. The conductive wall 132 includes a first wall portion 144a extending over the peripheral region 120 of the first die 104 and projecting vertically alongside the die stack 124, a second wall portion 144b extending over the upper second die 106 of the die stack 124, and a third wall portion 144c generally surrounding the exterior side of the cavity 136. In some embodiments, the envelope 110 of the TTD 108 can be formed from thermally conductive materials, such as copper, aluminum, ceramic materials, or other materials having suitably high thermal conductivities. In one embodiment, the envelope 110 is formed from extruded metal that is crimped or bent to define the shape of the envelope. In another embodiment, the envelope 110 is formed from conductive metal members joined together by brazing or other metal joining processes. In these and other embodiments, the conductive wall 132 of the envelope can be formed from a thin metal having a thickness that is less than or equal to 3 mm (e.g., 1 mm or less). In certain embodiments, the TTD 108 can include other structures and/or features attached to or integral formed in the conductive wall 132 for enhanced heat dissipation. For example, the TTD 108 can include an additional heat sink (not shown), such as conductive fins or an additional outer casing, attached to the package support substrate 102, or the conductive wall can be made from a semiconductor material (e.g., silicon).

The working fluid 140 can include, for example, alcohol (e.g., methanol), ammonia, acetone, water, (e.g., distilled water), or other suitable heat transfer fluids chosen according to the operating temperature of the assembly 100 and/or material(s) of the envelope 110. For example, in one embodiment water can be used as a working fluid in a conductive envelope formed from copper, and can provide evaporative cooling over a temperature range of, e.g., 20 to 150° C. The wicking feature 138 can include, for example, a sintered powder (e.g., powdered copper), a porous or mesoporous material, a mesh material (e.g., a copper mesh), or other suitable material for transporting the working fluid 140 (e.g., via capillary forces) along the conductive wall 132 of the envelope 110 when the working fluid 140 is in a saturated or liquid phase. In some embodiments, the wicking feature 138 can include surface features, such as grooves (not shown), configured to facilitate fluid transport.

In the embodiment illustrated in FIG. 1, the cavity 136 extends over the upper second die 106 and the peripheral region 120 of the first die 104, and surrounds the die stack 124. The cavity 136 can be filled with the working fluid 140 through an opening 148 of a fluid inlet 142 extending through the conductive wall 132 of the envelope 110. The fluid inlet 142 can be capped with a plug 146 (e.g., a metal or plastic plug) that seals (e.g., hermetically seals) the cavity 136. In at least some embodiments, the plug 146 may be removable from the opening 148 so that the working fluid 140 can be replenished through the inlet 142. In other embodiments, the fluid inlet 142 can be permanently sealed. For example, in one embodiment the conductive wall 132 can include integral tabs 150 (shown in phantom lines) adjacent the fluid inlet 142 and which can be bent (e.g., crimped) to close the opening 148 and substantially seal the fluid inlet 142.

Figure 2:
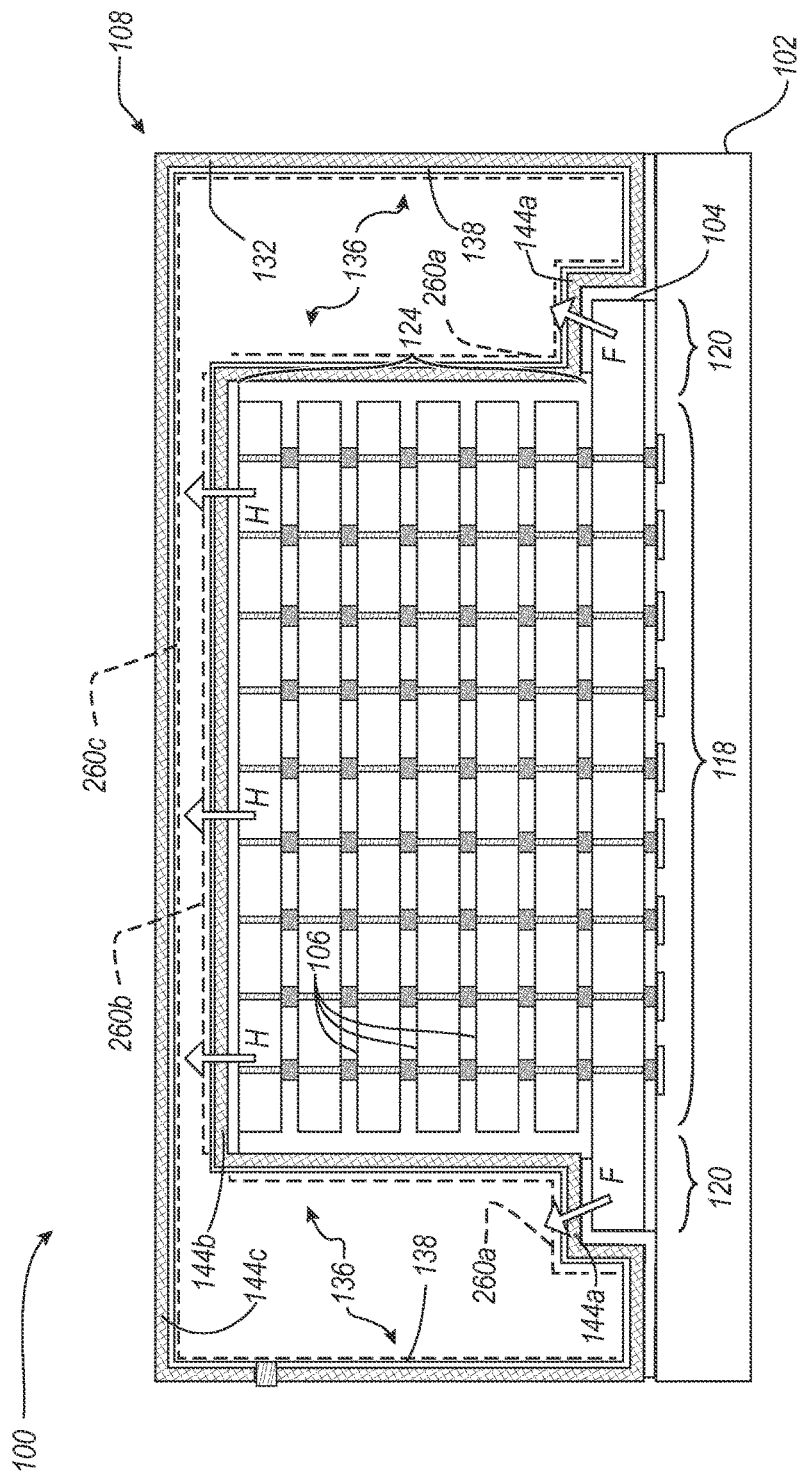
FIG. 2 is a cross-sectional view of the semiconductor device assembly of FIG. 1 after it has been heated to an elevated temperature in accordance with an embodiment of the present technology.

In FIG. 1, the assembly 100 is at a first temperature level $T_1$ (e.g., room temperature) below operating temperature, and the working fluid 140 is substantially in a liquid-phase at the first temperature level $T_1$. FIG. 2 shows the assembly 100 after it has been heated from the first temperature level $T_1$ of FIG. 1 to a second temperature level $T_2$ greater than temperature level $T_1$ during operation. As shown in FIG. 2, the TTD 108 includes a plurality of fluid conversion regions 260 (referred to individually as a first evaporation region 260a, a second evaporation region 260b, and a condensation region 260c, respectively). The first evaporation region 260a includes the first wall portion 144a, the second evaporation region 260b includes the second wall portion 144b, and the condensation region 260c includes the third wall portion 144c. The fluid conversion regions 260 can also include a portion of the wicking feature 138.

As the assembly 100 is heated to and/or operating at the second temperature $T_2$, the peripheral region 120 of the first die 104 transfers its heat into the first evaporation region 260a through the first wall portion 144a of the TTS 108, as shown by arrows F. The second dies 106, similarly, transfer their heat into the second evaporation region 260b through the second wall portion 144b, as shown by arrows H. The first and second wall portions 144a and 144b, in turn, transfer heat into liquid-phase, or saturated, volumes (not shown) of the working fluid 140 (FIG. 1) located in or near the evaporation regions 260a and 260b. The transferred heat raises the temperature of the saturated working fluid 140. Additionally, the working fluid 140 draws latent heat from the evaporation regions 260a and 260b as the saturated fluid approaches its vaporization temperature. This leads to further cooling of the first and second dies 104 and 106 and, ultimately, to evaporation of the saturated fluid in the cavity 136 into vapor phase. The vapor-phase fluid flows toward the condensation region 260c due to thermal diffusion and the difference in vapor pressure across the cavity 136 caused by the local heating in the evaporation regions 260a and 260b. The vapor-phase fluid condenses in the condensation region 260c due to the relatively lower temperature of the third wall portion 144c. As the working fluid 140 condenses, it releases its latent heat into the third wall portion 144c, and the wall portion 144c, in turn, transfers the latent heat to the external environment outside of the TTD 108. The condensed working fluid then returns to the evaporation regions 260a and 260b via the wicking feature 138 (e.g., via capillary action) and/or gravity, and evaporative cooling can continue as the condensed working fluid 140 is re-heated and vaporized in the evaporation regions 260a and 260b and, again, condensed in the condensation region 260c.

Without being bound to theory, it is believed that TTDs configured in accordance with the various embodiments of the present technology can provide highly efficient heat transfer and reduce the overall operating temperatures of the assembly 100 or other semiconductor device assemblies by at least 5° C. compared to similar assemblies having thermally conductive structures (e.g., solid-metal lid structures) formed without a vapor chamber. It is believed that in at least some of these embodiments, operating temperature can be reduced by 10° C. or more. Additionally, another advantage of the TTD 108 and related thermal transfer devices, is that they uniformly distribute heat across the assembly 100 due to the relatively large thermal diffusion rates of the vapor-phase fluid in the cavity 136. For example, a higher temperature vapor will typically flow toward a region occupied by a lower temperature vapor to achieve thermal equilibrium of the working fluid 140. In the case of HMC devices, this can be particularly useful because the first die 104 is usually a logic die and the second dies 106 are generally memory dies, and logic dies typically operate at a much higher power level than memory dies. Additionally, the integrated circuit components (e.g., SERDES components) in the peripheral region 120 generally have a higher power density than the integrated circuit components in the base region 118 beneath the memory dies, which results in higher temperatures at the peripheral region 120 and higher temperature vapors produced in the evaporation regions 260a and 260b. By contrast, other assemblies having thermally conductive structures formed with, e.g., solid materials (rather than hollow vapor chambers) do not achieve the same thermal equilibrium because solid materials have a lower rate of thermal diffusion than vapor. As a result, the heat typically concentrates in the conductive structure above the higher temperature regions of these assemblies, such as above the peripheral region of a logic die.

Figure 3:
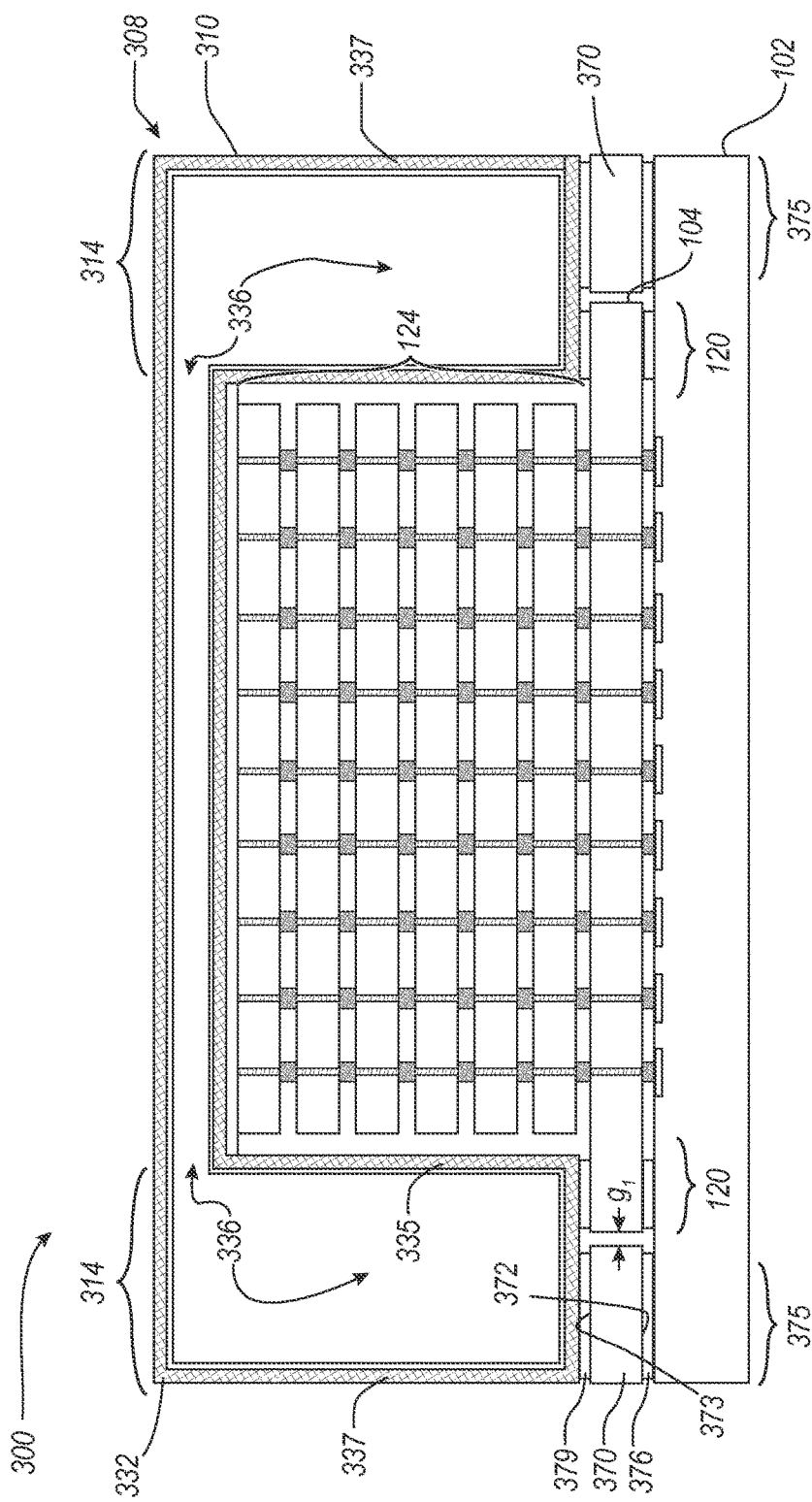
FIGS. 3-5 are cross-sectional views of semiconductor device assemblies configured in accordance with other embodiments of the present technology

FIG. 3 is a cross-sectional view of a semiconductor device assembly 300 ("assembly 300") having a TTD 308 configured in accordance with another embodiment of the present technology. Several features of the assembly 300 are similar to those described above with respect to the assembly 100. For example, the assembly can include the die stack 124 arranged on the first die 104, and the TTD 308 can include a conductive structure 310 having a conductive wall 332 and an internal cavity 336 partially filled with a working fluid (not shown). In the embodiment illustrated in FIG. 3, however, the TTD 308 includes a generally solid conductive member, or spacer 370, having a first side 372 attached to a peripheral region 375 of the package support substrate 102 with a first adhesive 376 (e.g., a TIM), and a second side 373 opposite the first side 372 and attached to an outer region 314 of the conductive structure 310 with a second adhesive 379 (e.g., a TIM). In some embodiments, the spacer 370 can be attached to the peripheral region 120 of the first die 104 with an adhesive (not shown) located in a gap $g_1$ between the peripheral region 120 and the spacer 370. In other embodiments, the gap $g_1$ can be omitted, and the spacer 370 can directly contact the peripheral region 120. In certain embodiments, the spacer 370 can mechanically stiffen the conductive structure 310. For example, the spacer 370 can reduce the length of vertical wall portions 335 and 337 along the interior and exterior sides, respectively, of the conductive wall 332. In some cases, the shorter vertical wall portions 335 and 337 can be less prone to deform or collapse when mechanical forces are applied to the conductive wall 332, such as when installing the TTD 308 on package support substrate 102, or when installing the assembly 300 on an external support substrate (e.g., a printed circuit board; not shown). Further, the shape of the conductive wall 332 may be relatively easier to form compared to the shape of the conductive wall 132 of the TTD 108 of FIG. 1. In particular, the conductive wall 332 does not wrap around the lateral edge of the first die 104, but instead projects along a straight path above the spacer 370. In cases where the conductive wall 332 is formed from crimped or bent metal, this can reduce the number of bends or folds needed to form the exterior shape of the TTD 308. In some embodiments, the spacer 370 can be formed from a thermally conductive material, such as copper, aluminum, nickel, or other material having a suitably high thermal conductivity. In other embodiments, the spacer 370 can be formed from a semiconductor material, such as silicon. For example, in one embodiment, the spacer can be been cut or cleaved from a silicon wafer.

Figure 4:
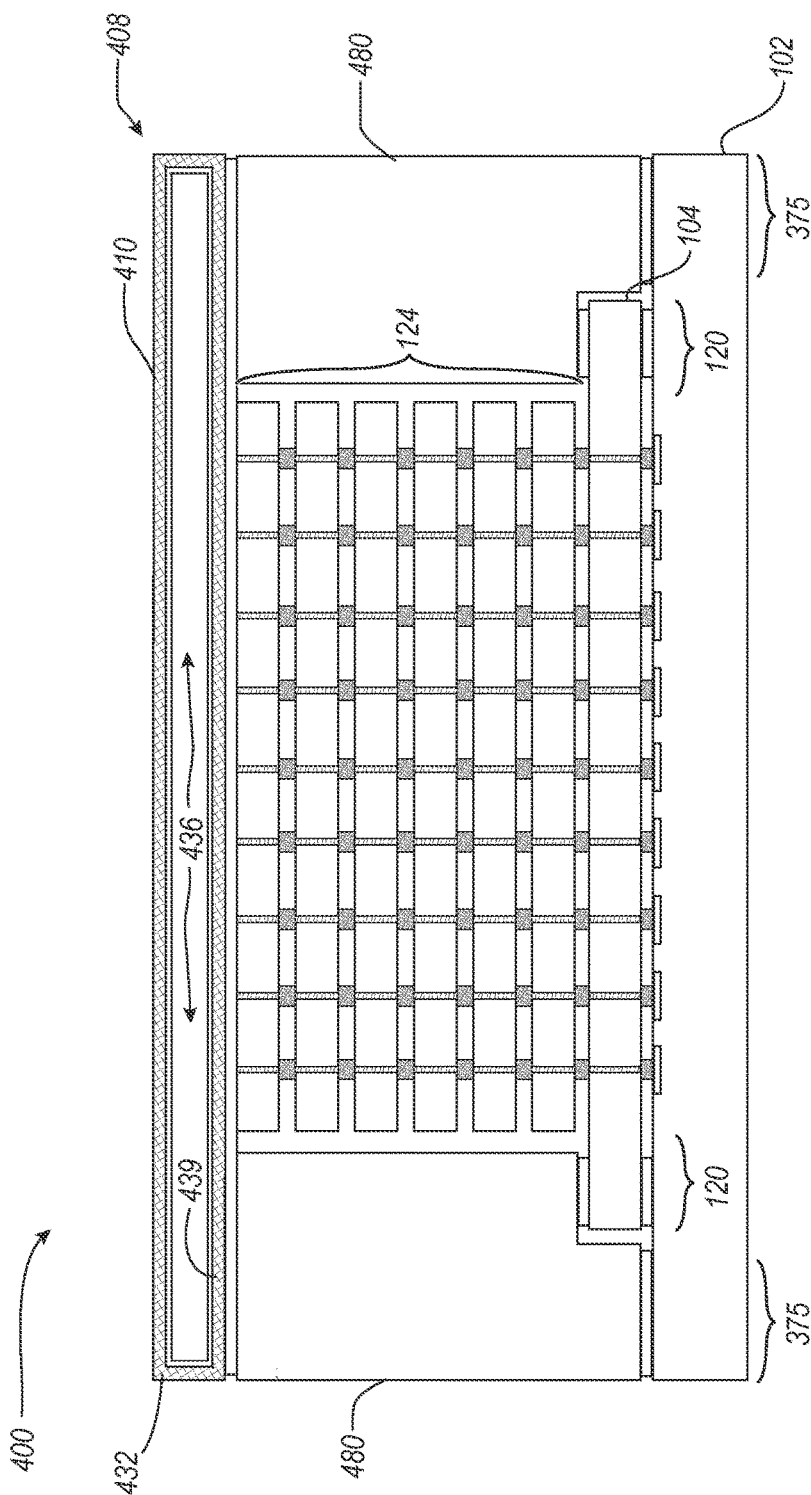

FIG. 4 is a cross-sectional view of a semiconductor device assembly 400 ("assembly 400") having a TTD 408 configured in accordance with another embodiment of the present technology. Several features of the assembly 400 are similar to those described above with respect to the assemblies 100 and 300 described above. For example, the TTD 408 can include a conductive structure 410 having a conductive wall 432 and an internal cavity 436 partially filled with a working fluid (not shown). In the embodiment illustrated in FIG. 4, however, the conductive wall 432 is generally rectangular in cross-section in the plane of the figure, and the TTD 408 does not extend downwardly toward the first die 104. Instead, the TTD 408 includes a conductive member, or spacer 480, projecting vertically from the peripheral regions 120 and 375 of the first die 104 and the package support substrate 102, respectively, and alongside the first die 104 and the die stack 124. Similar to the spacer 370 of FIG. 3, the spacer 480 can be formed from a variety of thermally conductive materials, such as copper, aluminum, silicon, etc. In at least some embodiments, the rectangular shape of the conductive wall 432 may be relatively easier to manufacture (e.g., from crimped metal) than the "C-shape" of the conductive walls of the TTDs 108 and 308 of FIGS. 1 and 3. The conductive wall 432 can, nevertheless, form a vapor chamber that substantially increases heat transfer and heat distribution uniformity relative to other device assemblies having thermal transfer devices without vapor chambers. For example, a portion 439 of the conductive wall 432 can transfer heat from at least the peripheral region 120 of the first die 104 to the vapor chamber via the spacer 480.

Figure 5:
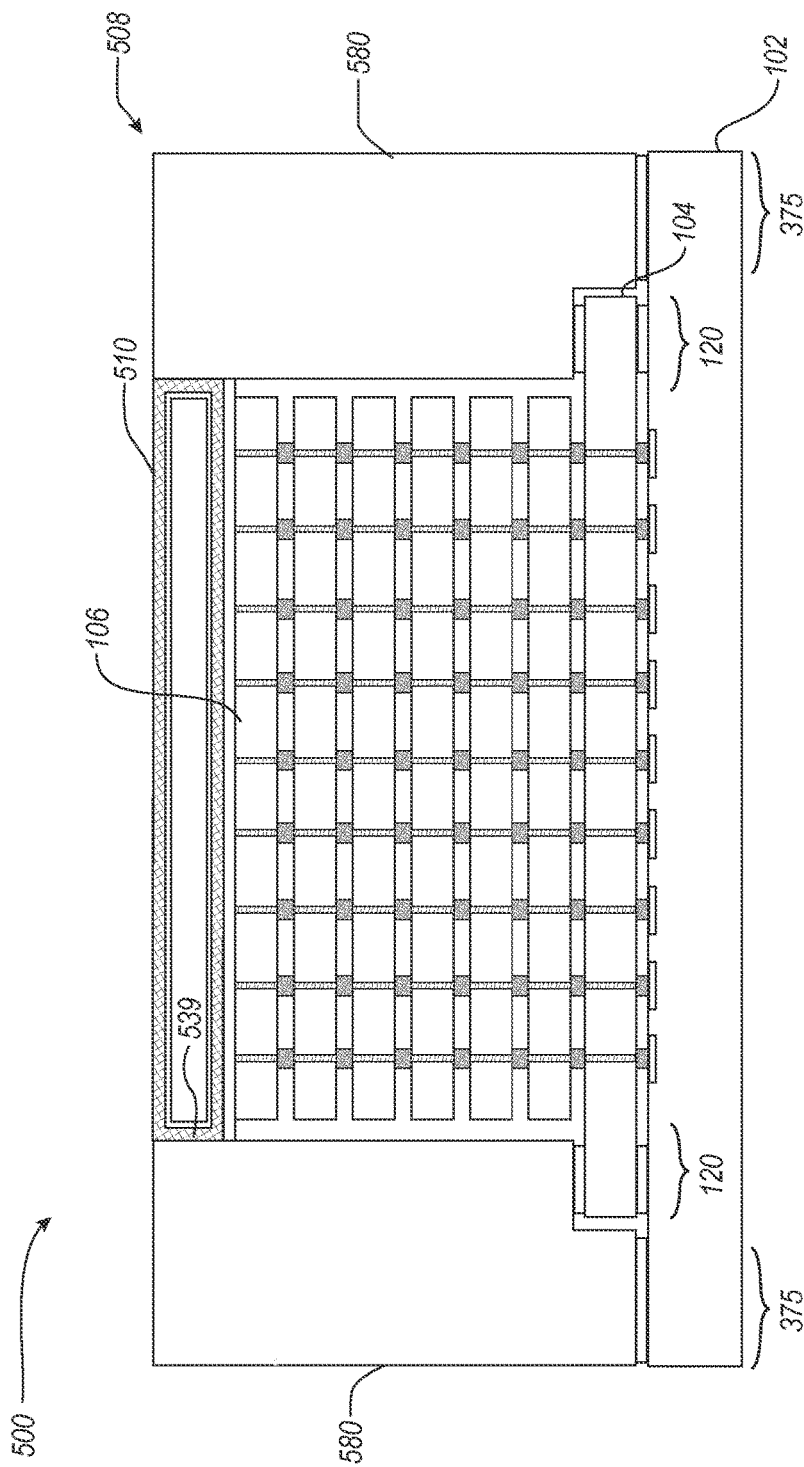

FIG. 5 is a cross-sectional view of a semiconductor device assembly 500 ("assembly 500") having a TTD 508 configured in accordance with another embodiment of the present technology. The TTD 508 is generally similar to the TTD 408 of FIG. 4, but includes a generally solid conductive member 580 that projects beyond the elevation of the upper second die 106. The TTD 508 also includes a thermal transfer structure 510 that lies within the footprint of the die stack 124, and thus does not extend over the peripheral regions 120 and 375 of the first die 104 and the package support substrate 102, respectively. Similar to the TTD 408, the TTD 508 can include a conductive wall portion 539 that transfers heat from at least the peripheral region 120 of the first die 104 to the vapor chamber via the spacer 580.

Figure 6:
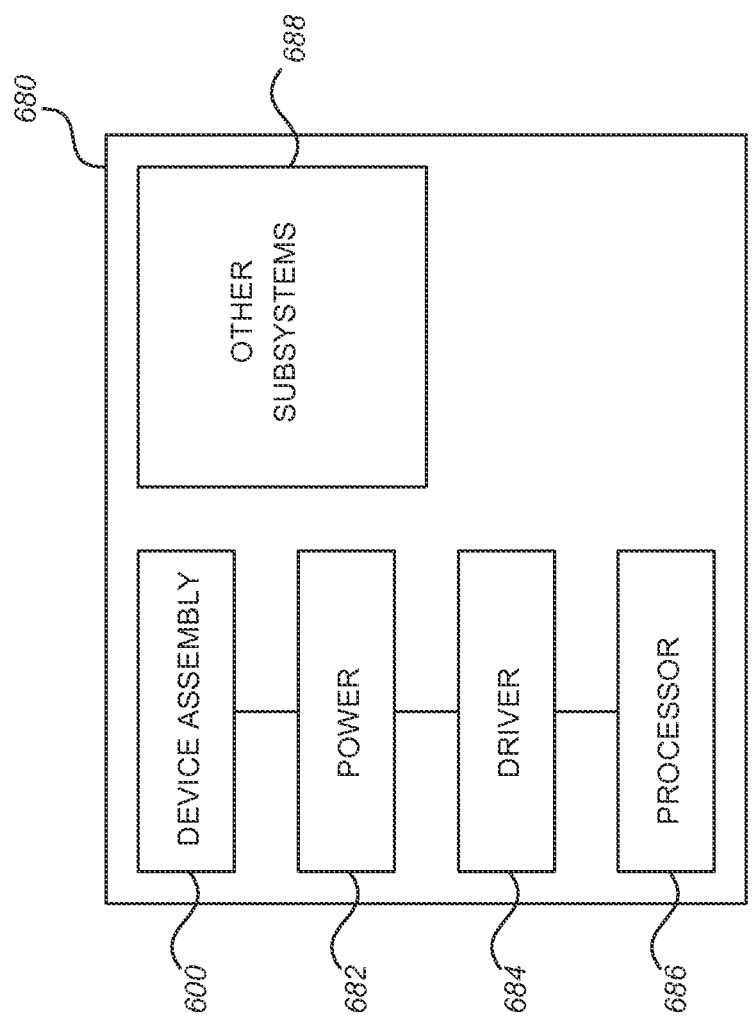
FIG. 6 is a schematic view of a system that includes a semiconductor device in accordance with embodiments of the present technology.

Any one of the stacked semiconductor device assemblies described above with reference to FIGS. 1-5 can be incorporated into any of a myriad of larger and/or more complex systems, a representative example of which is system 680 shown schematically in FIG. 6. The system 680 can include a semiconductor device assembly 600, a power source 682, a driver 684, a processor 686, and/or other subsystems or components 688. The semiconductor device assembly 600 can include features generally similar to those of the semiconductor device assemblies described above with reference to FIGS. 1-5, and can therefore include various features that enhance heat dissipation. The resulting system 680 can perform any of a wide variety of functions, such as memory storage, data processing, and/or other suitable functions. Accordingly, representative systems 680 can include, without limitation, hand-held devices (e.g., mobile phones, tablets, digital readers, and digital audio players), computers, vehicles, appliances and other products. Components of the system 680 may be housed in a single unit or distributed over multiple, interconnected units (e.g., through a communications network). The components of the system 480 can also include remote devices and any of a wide variety of computer readable media.

From the foregoing, it will be appreciated that specific embodiments of the technology have been described herein for purposes of illustration, but that various modifications may be made without deviating from the disclosure. Further, although many of the embodiments of the semiconductor dies assemblies are described with respect to HMCs, in other embodiments the semiconductor die assemblies can be configured as other memory devices or other types of stacked die assemblies. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor device assembly, comprising:
a support substrate;
a first semiconductor die on the support substrate and having a base region and a peripheral region adjacent to the base region;
a second semiconductor die at the base region; and
a thermal transfer device attached to the support substrate and the peripheral region of the first semiconductor die, wherein the thermal transfer device is directly attached to the support substrate via an adhesive material, wherein the thermal transfer device extends over the second semiconductor die, and wherein the thermal transfer device includes a conductive structure having a sealed internal chamber at least over the second semiconductor die and a working fluid at least partially filling the chamber, wherein the conductive structure includes—
a first fluid conversion region within the chamber that transfers heat from at least the peripheral region of the first semiconductor die to a volume of the working fluid to vaporize the volume in the chamber, and
a second fluid conversion region within the chamber that condenses the volume of the working fluid in the chamber after it has been vaporized.

2. The semiconductor device assembly of claim 1 wherein the conductive structure further includes a third fluid conversion region that transfers heat from at least the second semiconductor die to a volume of the working fluid.

3. The semiconductor device assembly of claim 1 wherein the thermal transfer device includes a wicking feature in the chamber.

4. The semiconductor device assembly of claim 1 wherein:
the conductive structure includes a conductive wall defining the chamber and extending over the second semiconductor die; and
the second fluid conversion region includes at least a portion of the conductive wall extending over the second semiconductor die.

5. The semiconductor device assembly of claim 1 wherein:
the conductive structure includes a conductive wall defining the chamber and extending over the second semiconductor die and the peripheral region of the first semiconductor die;
the first fluid conversion region includes a first portion of the conductive wall extending over the peripheral region of the first semiconductor die; and
the second fluid conversion region includes a second portion of the conductive wall extending over the second semiconductor die.

6. The semiconductor device assembly of claim 5 wherein the first portion of the conductive wall extends laterally over the first peripheral region and then vertically adjacent the second semiconductor die.

7. The semiconductor device assembly of claim 1 wherein the chamber surrounds the second semiconductor die.

8. The semiconductor device assembly of claim 1 wherein the chamber is over the peripheral region of the first semiconductor die.

9. The semiconductor device assembly of claim 1 wherein the first semiconductor die comprises a logic die, and the second semiconductor die comprises a memory die.

10. The semiconductor device assembly of claim 9 wherein the memory die is a first memory die, and wherein the semiconductor device assembly further comprises a second memory die between the first memory die and the thermal transfer device.

11. The semiconductor device assembly of claim 1 wherein the first semiconductor die has a perimeter, wherein the peripheral region is adjacent to the perimeter, and wherein the base region is inboard of the peripheral region.

12. The semiconductor device assembly of claim 1 wherein the thermal transfer device and the first semiconductor die form an enclosure that contains the second semiconductor die.

13. The semiconductor device assembly of claim 12 wherein the second semiconductor die has a perimeter, and wherein the thermal transfer device surrounds the entire perimeter of the second semiconductor die.

14. A semiconductor device assembly, comprising:
a support substrate;
a plurality of semiconductor dies including a first die and a stack of second dies on the first die;
a generally solid conductive member attached to the support substrate via a first adhesive; and
a conductive structure attached to the conductive member via a second adhesive, wherein the conductive structure has a conductive wall forming an enclosure with the first semiconductor die and/or the conductive member, wherein the enclosure contains the stack of second semiconductor dies, wherein the conductive wall defines a sealed internal chamber within the conductive structure that is filled with a working fluid and that is at least over the second semiconductor die, and wherein the conductive wall includes—
 a first wall portion through which heat produced by one or more of the semiconductor dies is transferred to the working fluid, and
 a second wall portion upon which the working fluid condenses.

15. The semiconductor device assembly of claim 14 wherein the conductive member comprises copper.

16. The semiconductor device assembly of claim 14 wherein the conductive member comprises a silicon spacer.

17. The semiconductor device assembly of claim 14 wherein the first wall portion of the conductive wall is at least proximate the first die, and the second wall portion is spaced apart from the first portion and extends laterally over the stack of second semiconductor dies.

18. The semiconductor device assembly of claim 17 wherein the first wall portion projects from the first die and extends along the stack of second dies.

19. The semiconductor device assembly of claim 14 wherein the first wall portion surrounds the stack of second dies.

20. The semiconductor device assembly of claim 14, further comprising a wicking feature in the chamber over at least one of the first and second wall portions of the conductive wall.

21. The semiconductor device assembly of claim 20 wherein the wicking feature comprises a sintered powder.

22. The semiconductor device assembly of claim 14 wherein the working fluid includes at least one of water, alcohol, or ammonium.

23. The semiconductor device assembly of claim 14 wherein the conductive structure is formed from copper.

24. The semiconductor device assembly of claim 14 wherein the plurality of semiconductor dies is configured to form a memory device.

25. The semiconductor device assembly of claim 14 wherein the conductive wall entirely surrounds a perimeter of the stack of second dies.

26. A semiconductor device assembly, comprising:
a logic die having a perimeter, a base region and a peripheral region, wherein the peripheral region is adjacent to the perimeter, and wherein the base region is laterally inboard of the peripheral region;
a stack of memory dies on the base region of the logic die; and
a thermally conductive device proximate the stack of memory dies, wherein the thermally conductive device includes (a) an upper region attached to the stack of memory dies and (b) an outer region adjacent the stack of memory dies and attached to the peripheral region of the logic die, wherein the upper and outer regions define an enclosure with the logic die that contains the stack of memory dies, wherein the thermally conductive device includes a sealed internal vapor chamber thermally coupled to the peripheral region of the logic die, and wherein a portion of the vapor chamber extends over the stack of memory dies.

27. The semiconductor device assembly of claim 26 wherein the thermally conductive device includes a working fluid in the vapor chamber.

28. The semiconductor device assembly of claim 26 wherein the upper region is integral with the outer region.

29. The semiconductor device assembly of claim 26 wherein a portion of the vapor chamber extends into the outer region.

30. The semiconductor device assembly of claim 26 wherein the outer region of the thermally conductive device entirely surrounds a perimeter of the stack of memory dies.

31. The semiconductor device assembly of claim 26, further comprising a package substrate, wherein the logic die is coupled to the package substrate, and wherein the outer region of the thermally conductive device is directly attached to the package substrate via an adhesive material.

* * * * *